(12) United States Patent
Kim et al.

(10) Patent No.: US 8,018,400 B2
(45) Date of Patent: Sep. 13, 2011

(54) PLASMA DISPLAY AND DRIVING METHOD THEREOF

(75) Inventors: Myoung-Kwan Kim, Yongin-si (KR); Jae-Seok Jeong, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 992 days.

(21) Appl. No.: 11/976,582

(22) Filed: Oct. 25, 2007

(65) Prior Publication Data
US 2008/0106499 A1 May 8, 2008

(30) Foreign Application Priority Data
Nov. 2, 2006 (KR) .......................... 10-2006-0107744

(51) Int. Cl.
*G09G 3/28* (2006.01)
(52) U.S. Cl. ....................................................... 345/60
(58) Field of Classification Search .............. 345/60–72; 315/169.1–169.4; 438/381
See application file for complete search history.

(56) References Cited

U.S. PATENT DOCUMENTS

| 6,362,012 | B1 * | 3/2002 | Chi et al. ........................... 438/3 |
| 7,046,217 | B2 | 5/2006 | Choi |
| 7,050,022 | B2 * | 5/2006 | Kigo et al. ........................ 345/66 |
| 7,053,869 | B2 * | 5/2006 | Choi ................................. 345/60 |
| 7,599,193 | B2 * | 10/2009 | Park et al. ...................... 361/783 |
| 2003/0107049 | A1 * | 6/2003 | Tomita ........................... 257/107 |
| 2004/0217440 | A1 * | 11/2004 | Ng et al. ........................ 257/528 |
| 2004/0222003 | A1 * | 11/2004 | Kim et al. .................... 174/35 R |
| 2005/0012690 | A1 * | 1/2005 | Choi ................................. 345/60 |
| 2005/0082957 | A1 * | 4/2005 | Hoppenbrouwers et al. ..... 313/3 |
| 2005/0116886 | A1 | 6/2005 | Jeong et al. |
| 2007/0046586 | A1 * | 3/2007 | Choi ................................. 345/68 |
| 2009/0073153 | A1 * | 3/2009 | Yamate .......................... 345/211 |

FOREIGN PATENT DOCUMENTS

| CN | 1405747 A | 3/2003 |
| CN | 1766958 A | 5/2006 |
| CN | 1831915 A | 9/2006 |
| JP | 2001-077538 A | 3/2001 |
| JP | 2001-255849 A | 9/2001 |
| JP | 2001-352022 A | 12/2001 |
| JP | 2005-157294 A | 6/2005 |
| KR | 10-2003-0029719 A | 4/2003 |

* cited by examiner

*Primary Examiner* — Alexander Eisen
*Assistant Examiner* — Patrick Marinelli
(74) *Attorney, Agent, or Firm* — Lee & Morse, P.C.

(57) ABSTRACT

A plasma display device (PDP) and method of driving it (during an address period) are provided. Such a PDP has an address electrode for receiving an address pulse and a capacitor. Such an address pulse has states including a first voltage and a smaller second voltage smaller. Such a capacitor stores a third voltage that is between the first and third voltages. Such a method includes: coupling the capacitor to the address electrode via the inductor; firstly energizing, via the inductor, the address electrode with the third voltage stored in the capacitor; secondly energizing the address electrode with the first voltage; thirdly energizing, via the inductor, the capacitor with voltage on the address electrode; and fourthly energizing the address electrode with the second voltage. Real power transfer during the first and third energizations is facilitated via reactive power transfer arising from LC resonance.

10 Claims, 12 Drawing Sheets

PLASMA DISPLAY AND DRIVING METHOD THEREOF

BACKGROUND OF THE INVENTION

1. Field of the Invention

Embodiments relate to a plasma display device and a driving method thereof.

2. Description of the Related Art

A plasma display device may be a flat panel display for displaying characters or images by using plasma generated by gas discharges, and several to hundreds of millions of pixels are arranged in the matrix format thereon according to their sizes.

A frame (1 TV field) in the plasma display device is divided into a plurality of subfields which are weighted and driven accordingly. Each subfield has a reset period, an address period, and a sustain period with respect to time.

The reset period is for initializing the status of each discharge cell so as to facilitate an addressing operation on the discharge cell, and the address period is for applying an address voltage to a cell that is to be turned on (an addressed cell) and accumulating wall charges therein. That is, in the address period, a scan pulse is sequentially applied to a plurality of scan electrodes, and an address pulse is applied to the address electrode. In this instance, an address discharge is generated at the cell to which the scan pulse and the address pulse are simultaneously applied. In the sustain period, sustain discharges are generated corresponding in number to the weight of the corresponding subfield in the given cell that is to be turned on so that an image is displayed.

Significant amounts of reactive power may be required to provide a reference voltage to a plasma display panel (PDP) that represents a capacitive load in addition to discharging an address voltage from the PDP when performing an address operation. In this instance, further address power is consumed when there are many switching times for the switch for applying address data to the address electrode.

SUMMARY OF THE INVENTION

Embodiments of the present invention are therefore directed to a plasma display device and a driving method thereof which substantially overcomes one or more of the disadvantages of the related art.

It is therefore a feature of an embodiment of the present invention to provide a plasma display device exhibiting an advantage of reduced power consumption during an address period.

It is therefore a feature of an embodiment of the present invention to provide a plasma display device and a driving method thereof having an advantage of increasing an efficiency of power consumption.

At least one of the above and other features and advantages of embodiments may be realized by providing a plasma display device including an electrode, a printed circuit board, an driving circuit, a capacitor, and an inductor. The electrode receives a pulse having states that include a first voltage and a second voltage smaller than the first voltage. The driving circuit includes a plurality of switches coupled between the PCB and the electrode and applies the pulse to the electrode, the driving circuit being provided on the printed circuit board. The capacitor stores a third voltage that is between the first voltage and the second voltage, the capacitor being provided on the printed circuit board. The inductor couples the driving circuit and the capacitor, the inductor being provided by at least one wire pattern on the printed circuit board.

At least one of the above and other features and advantages of embodiments may be realized by providing a method for driving a plasma display device (PDP) during an address period. Such a PDP includes an address electrode for receiving an address pulse and a capacitor coupled to the address electrode. Such an address pulse has a first voltage and a second voltage smaller than the first voltage. Such a capacitor stores a third voltage that is between the first voltage and the second voltage. Such a method includes: coupling the capacitor to the address electrode of the PDP via the inductor (which can be realized as a wire pattern on at least one substrate layer of a multi-substrate-layer of a printed circuit board); firstly energizing, via the inductor, the address electrode with the third voltage stored in the capacitor to the address electrode, real power transfer during the first energization being facilitated via reactive power transfer arising from LC resonance; secondly energizing, after the first energization, the address electrode with the first voltage by coupling a power source for the first voltage to the address electrode; thirdly energizing, after the second energization and via the inductor, the capacitor with voltage on the address electrode, real power transfer during the third energization being facilitated via reactive power transfer arising from LC resonance; and fourthly energizing, after the third energization, the address electrode with the second voltage by coupling a power source for the second voltage to the address electrode.

BRIEF DESCRIPTION OF THE DRAWINGS

The above and other features and advantages of the present invention will become more apparent to those of ordinary skill in the art by describing in detail example embodiments thereof with reference to the attached drawings, in which.

DETAILED DESCRIPTION OF THE INVENTION

Figure 1:
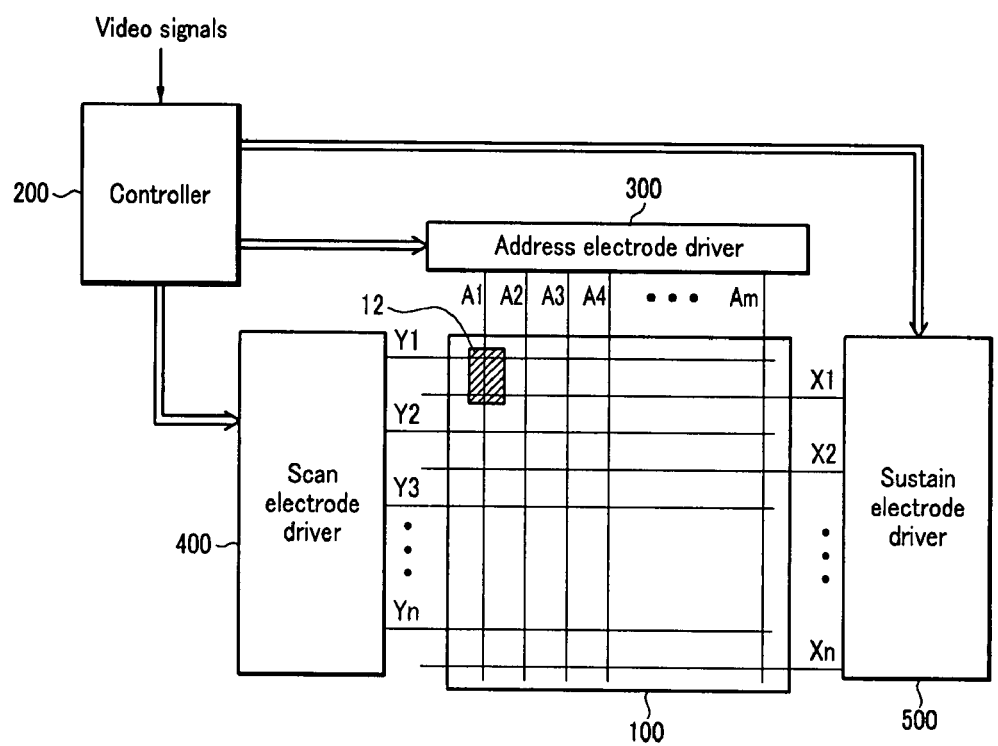
FIG. 1 illustrates a top plan view for a plasma display device according to an example embodiment of the present invention.

Korean Patent Application No. 10-2006-0107744 filed on Nov. 2, 2006, in the Korean Intellectual Property Office and entitled: "Plasma Display and Driving Method Thereof," is incorporated by reference herein in its entirety.

Example embodiments of the present invention will hereinafter be described in detail with reference to the accompanying drawings.

In the following detailed description, only certain example embodiments of the present invention have been shown and described, simply by way of illustration. As those skilled in the art would realize, the described example embodiments may be modified in various different ways, all without departing from the spirit or scope of the present invention. To simplify the drawings, parts that are not related to descriptions are omitted, and the same or similar parts over the specification have the same or similar reference numerals.

A plasma display device and a driving method according to example embodiments of the present invention will now be described with reference to drawings.

FIG. 1 illustrates a top plan view for a plasma display device according to an example embodiment of the present invention.

As depicted in FIG. 1, the plasma display device may include a plasma display panel (PDP) 100, a controller 200, an address electrode driver 300, a scan electrode driver 400, and a sustain electrode driver 500.

The plasma display panel (PDP) 100 may include a plurality of address electrodes A1-Am in the column direction, and a plurality of sustain electrodes X1-Xn and scan electrodes Y1-Yn in pairs in the row direction. The sustain electrodes X1-Xn may be provided to correspond to the respective scan electrodes Y1-Yn, and the sustain electrodes X1-Xn and the scan electrodes Y1-Yn perform a display operation for displaying images in the sustain period. The address electrodes A1-Am may be arranged to cross the sustain electrodes X1-Xn and the scan electrodes Y1-Yn. In this instance, a discharge space at the crossing regions of the address electrodes A1-Am, the scan electrodes Y1-Yn, and the sustain electrodes X1-Xn form a cell 12. The above-described plasma display panel (PDP) 100 is but one example, and panels of different configurations to which subsequent driving methods are applicable can be applied to the present invention.

The controller 200 may receive a video signal to output an address electrode drive control signal, a sustain electrode drive control signal, and a scan electrode drive control signal. The controller 200 may divide a frame into a plurality of subfields and drives the subfields. Each subfield may have a reset period, an address period, and a sustain period with respect to time.

The address electrode driver 300 may receive an address electrode drive control signal from the controller 200 and applies a display data signal for selecting a discharge cell to be displayed to the respective address electrodes.

The scan electrode driver 400 may receive a scan electrode drive control signal from the controller 200 and applies a driving voltage to the scan electrode.

The sustain electrode driver 500 may receive a sustain electrode drive control signal from the controller 200 and applies a driving voltage to the sustain electrode.

The scan and sustain electrode drivers 400 and 500 may be formed, e.g., on a board (not illustrated) on the rear part of the plasma display panel 100. For example, part of the address electrode driver 300 may be incorporated into the tape carrier package integrated circuit (TCP IC) (e.g., 700 in FIG. 6) coupling the board and the plasma display panel 100.

Figure 2:
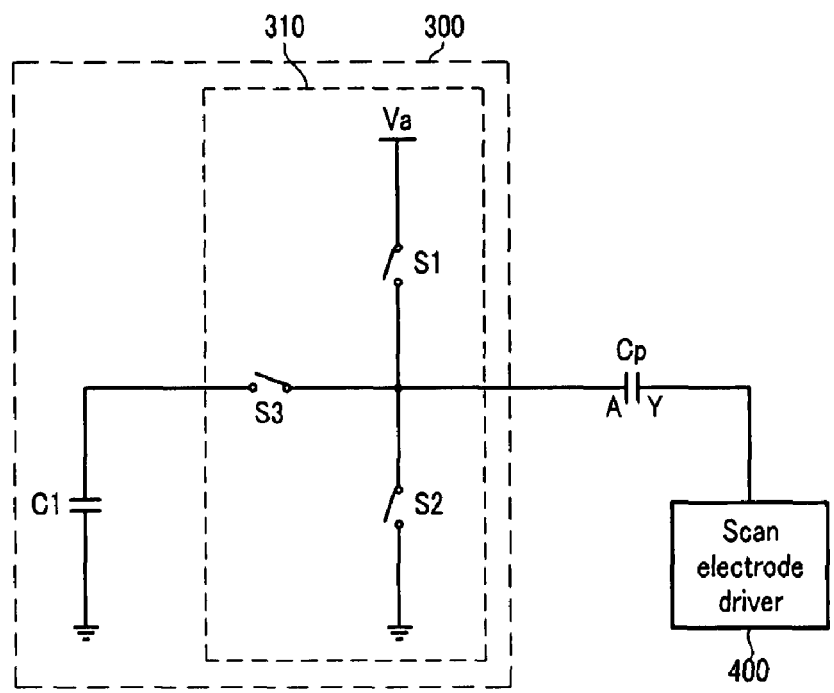
FIG. 2 illustrates a circuit diagram for an address electrode driver according to an example embodiment of the present invention.

FIG. 2 illustrates a circuit diagram for the address electrode driver 300 according to an example embodiment of the present invention.

As depicted in FIG. 2, the address electrode driver 300 may include a plurality of address driving circuits 310 coupled to a plurality of address electrodes, and a plurality of power recovery capacitors (C1) also coupled to the plurality of address electrodes. To simplify illustration, and ease description, FIG. 2 depicts only one address driving circuit 310 and one power recovery capacitor (C1) respectively connected to an address electrode. Also, a capacitance component formed between the address electrode and the scan electrode is illustrated as a panel capacitor (Cp) in FIG. 2. For example, Cp<C1. A subset of address driving circuits 310 from among the plurality thereof can be manufactured as an integrated circuit (IC).

The respective address driving circuits 310 may include switches (S1, S2, S3). In FIG. 2, the switches (S1, S2, S3) can be configured by, e.g., field effect transistors and insulated gate bipolar transistors. In this instance, each transistor can have, e.g., a body diode. When the switch (S3) has a body diode, the switch (S3) can be configured by, e.g., transistors connected in the back-to-back format so as to reduce (if not prevent) an unwanted electrical conduction path caused by the body diode.

The switch (S1) may be coupled between a terminal that supplies an address voltage Va and an address electrode (called out in FIG. 2 as a node, A) of the panel capacitor (Cp). The switch (S2) may be coupled between a power for supplying a voltage less than the address voltage (e.g., ground voltage in FIG. 2) and an address electrode of the panel capacitor (Cp).

A signal for turning on the switch (S1) may be applied to a control terminal of the switch (S1) when an on data signal is applied to the address electrode, and a signal for turning on the switch (S2) may be applied to a control terminal of the switch (S2) when an off data signal is applied to the address electrode. Also, the switch (S3) may be coupled between an address electrode of the panel capacitor (Cp) and a recovery capacitor (C1).

At least one capacitor (C1) may be coupled in common to the address electrodes A1-Am, e.g., a given recovery capacitor (C1) may be coupled to a subset of the address electrodes. The capacitor (C1) supplies a voltage, e.g., between a Va voltage and 0V, e.g., about Va/2 voltage.

An operation by the address electrode driver 300 in FIG. 2 will now be described with reference to FIG. 3, FIG. 4A, and FIG. 4B.

Figure 3:
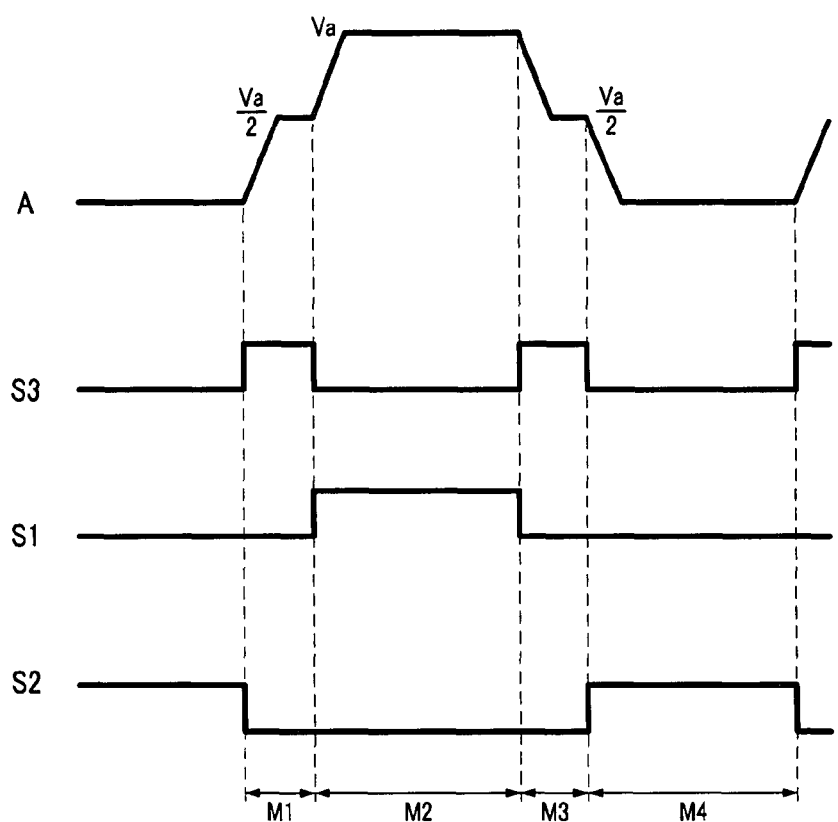
FIG. 3 illustrates a signal timing diagram of an address driving circuit for generating driving waveform applied to an address electrode according to an example embodiment of the present invention.
Figure 4A:
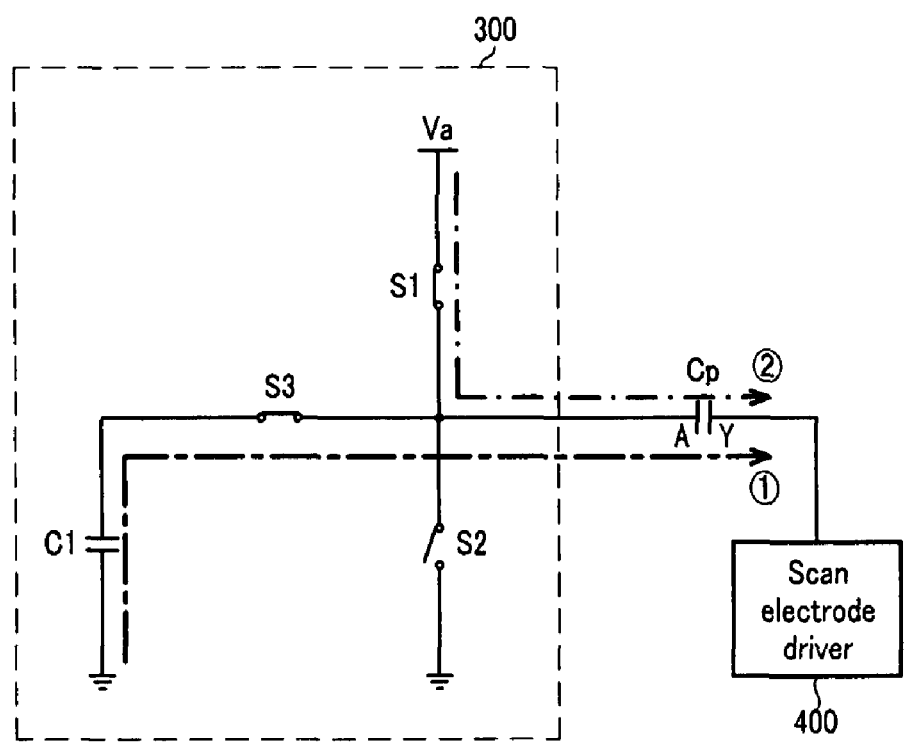
FIG. 4A and FIG. 4B illustrate an address power recovery operation by the address electrode driver depicted in FIG. 2.
Figure 4B:
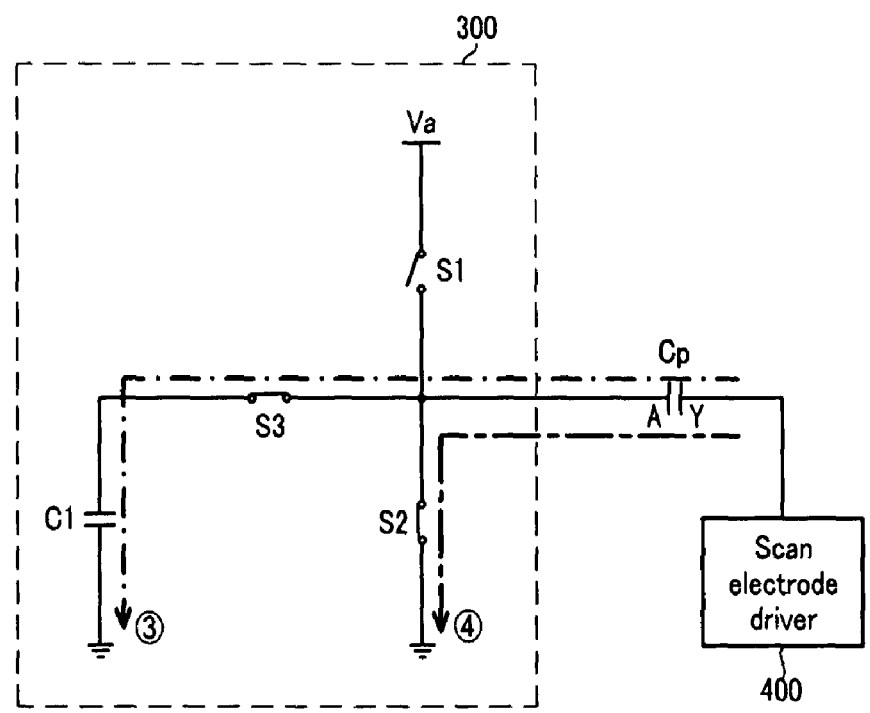

FIG. 3 illustrates a signal timing diagram of an address driving circuit 310 for generating driving waveform applied to the address electrode according to an example embodiment of the present invention. FIG. 4A and FIG. 4B illustrate an address power recovery operation by the address electrode driver 300 depicted in FIG. 2.

It is assumed in the driving waveforms depicted in FIG. 3 that address data may be consecutively varied from 0 to 1 and from 1 to 0.

It is assumed that the switch (S1) and the switch (S3) are turned off and the switch (S2) may be turned on to maintain the voltage at the panel capacitor (Cp) to be 0V and the capacitor (C1) may be pre-charged with about half the address voltage ($\approx$Va/2) before a period (M1) starts.

In the period (M1), the switch (S1) remains turned off, the switch (S3) may be turned on and the switch (S2) may be turned off. As depicted in FIG. 4A, a current path (①) is formed through the capacitor (C1), the switch (S3), and an address electrode of the panel capacitor (Cp). Through the path (①), the voltage charged in the power recovery capacitor (C1) is discharged to the panel capacitor (Cp) to increase the voltage at the panel capacitor (Cp) from 0V to $\approx$Va/2. In this instance, the address electrode driver 300 can increase the maximum voltage at the panel capacitor (Cp) to the voltage charged in the capacitor (C1), that is, ≈Va/2.

In the period (M2), the switch (S2) remains turned off, the switch (S3) may be turned off and the switch (S1) may be turned on. As depicted in FIG. 4A, a current path (②) is formed through the Va power terminal, the switch (S1), and an address electrode of the panel capacitor (Cp). Through the path (②), the Va voltage is applied to the address electrode of the panel capacitor (Cp) by hard switching.

In the period (M3), the switch (S2) remains turned off, the switch (S1) may be turned off and the switch (S3) may be turned on. As depicted in FIG. 4B, a current path (③) is formed through the panel capacitor (Cp), the switch (S3), and the power recovery capacitor (C1). Through the path (③), the voltage stored in the panel capacitor (Cp) is discharged to the power recovery capacitor (C1) in order to reduce the voltage at the panel capacitor (Cp) from substantially Va to ≈Va/2. In this instance, the address electrode driver 300 reduces the voltage at the panel capacitor (Cp) to ≈Va/2 in a like manner of increasing the voltage.

In the period (M4), the switch (S1) remains turned off, the switch (S3) may be turned off and the switch (S2) may be turned on. As depicted in FIG. 4B, a current path (④) is formed through the panel capacitor (Cp), the switch (S2), and the ground voltage. Through the path (④), the 0V voltage is applied to the address electrode of the panel capacitor (Cp) by hard switching.

Accordingly, the period (M1) is for supplying the reactive power from the power recovery capacitor (C1) to the panel capacitor (Cp), and the period (M3) is for recovering the reactive power from the panel capacitor (Cp) to the power recovery capacitor (C1).

Accordingly, address power consumption caused by switching can be reduced and power consumption of the plasma display device can be reduced by turning on or off the switch (S3) to recover the power to the power recovery capacitor (C1).

Figure 5:
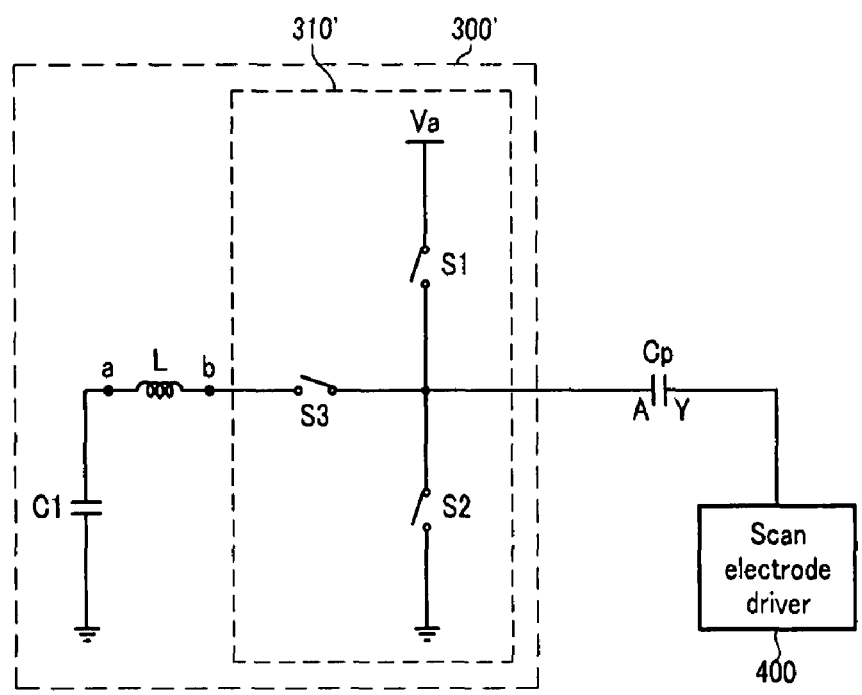
FIG. 5 illustrates a circuit diagram for an address electrode driver according to an example embodiment of the present invention.
Figure 6:
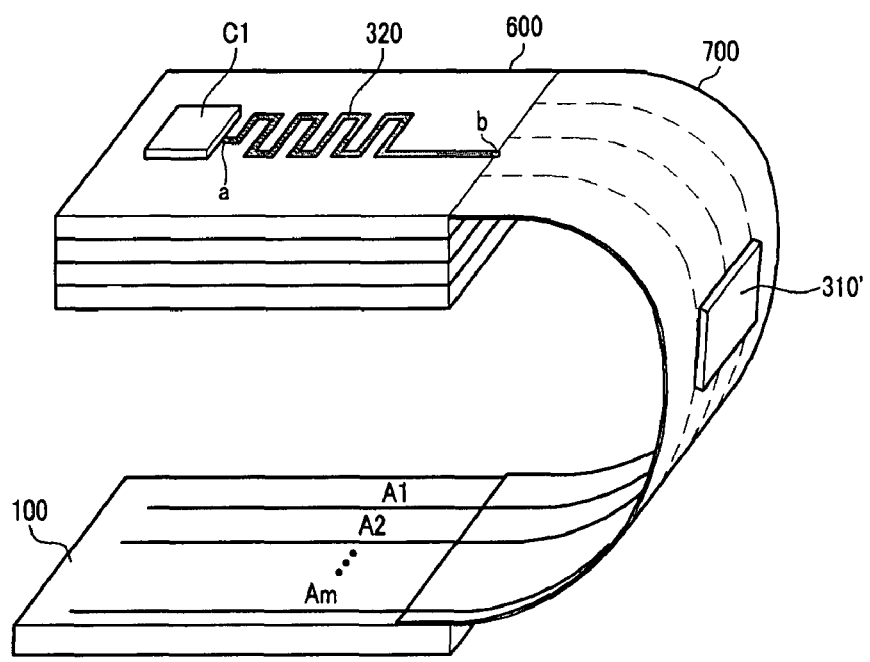
FIG. 6 illustrates an address electrode driver according to an example embodiment of the present invention.

FIG. 5 illustrates a circuit diagram for an address electrode driver 300' according to an example embodiment of the present invention. While the address electrode driver 300' is similar to the address electrode driver 300, the address electrode driver 300' differs at least by additionally providing an inductor (L) on the path that includes the power recovery capacitor (C1) and the switch (S3). FIG. 6 illustrates an address electrode driver 300' incorporated into a TCP IC (again, tape carrier package integrated circuit) 700 according to an example embodiment of the present invention.

As depicted in FIG. 5, the address electrode driver 300' may include a plurality of address driving circuits 310' coupled to the address electrode and a plurality of power recovery capacitors (C1) also coupled to the address electrodes albeit via a plurality of inductors (L). To simplify illustration and ease description, FIG. 5 depicts only one address driving circuit 310' coupled to a given one of the address electrodes, and only one power recovery capacitor (C1) and one inductor (L) by which the power recovery capacitor (C1) is coupled to the given address electrode. Similarly to FIG. 2, a capacitance component formed between the address electrode and the scan electrode is depicted in FIG. 6 as a panel capacitor (Cp). A subset of address driving circuits 310' from among the plurality thereof can be manufactured as an integrated circuit (IC).

As depicted in FIG. 6, the address electrode driver 300' depicted in FIG. 5 may be provided via the patterned printed circuit board (PCB) 600 and the TCP IC 700, where the TCP IC 700 couples the PCB 600 and the plasma display panel 100. The IC-type address driving circuit 310' may be incorporated into in the TCP IC 700, and the IC-type power recovery capacitor (C1) also may be provided on a substrate layer of the PCB 600. Also, the inductor (L) depicted in FIG. 5 may be formed on the PCB 600 with various wire patterns 320. In this instance, the wire pattern 320 of the inductor (L) may be formed to be a folded transmission line that if straightened out would be longer than a distance (the distance from the point a to the point b) for connecting the address driving circuit 310' and the capacitor (C1) with a straight line. The wire pattern 320 of the capacitor C1 and the inductor L are depicted in FIG. 6 as being provided on the same substrate layer, though alternatively they may be provided on different substrate layers.

Figure 7A:
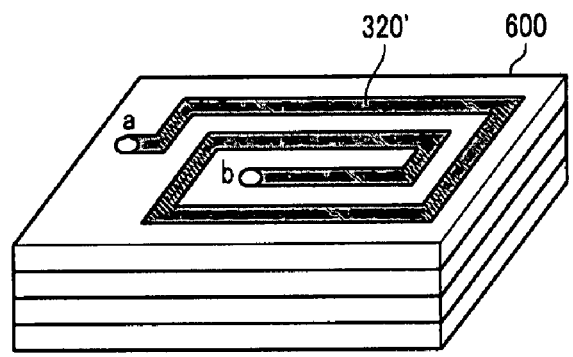
FIG. 7A and FIG. 7B illustrate partial perspective views of a printed circuit board for a modified wire pattern of an inductor (L) in an address electrode driver according to example embodiments of the present invention.
Figure 7B:
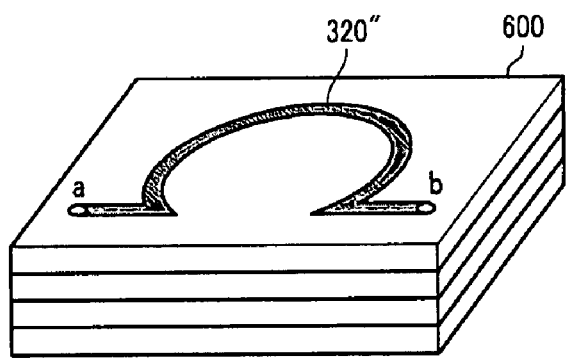

FIG. 7A and FIG. 7B illustrate partial perspective views of a printed circuit board for a modified wire pattern of the inductor (L) in the address electrode driver 300' according to example embodiments of the present invention.

As depicted in FIG. 7A and FIG. 7B, the wire pattern 320 of the inductor (L) depicted in FIG. 6 alternatively may be implemented as a whirling pattern or a horseshoe/Ω (Greek uppercase letter omega) pattern, respectively, and the inductance component is variable according to its thickness and length. Since the power recovery efficiency may be increased as the inductance of the inductor (L) is greater, the power recovery efficiency may be increased as the wire patterns (320, 320', 320") of the inductor (L) are thicker and longer.

It is noted that wire patterns of the inductor (L) are not restricted to the whirling pattern or the horseshoe pattern of FIGS. 7A-7B, and they include any other patterns that can be patterned on the PCB to manipulate the inductance.

Also, the wire patterns 320, 320', 320" of the inductor (L) are depicted in FIG. 6, FIG. 7A, and FIG. 7B, respectively, as being formed on a substrate layer of the PCB 600. However, portions of such wire patterns can be respectively formed across multiple substrate layers of the PCB 600, e.g., as depicted in FIG. 8.

Figure 8:
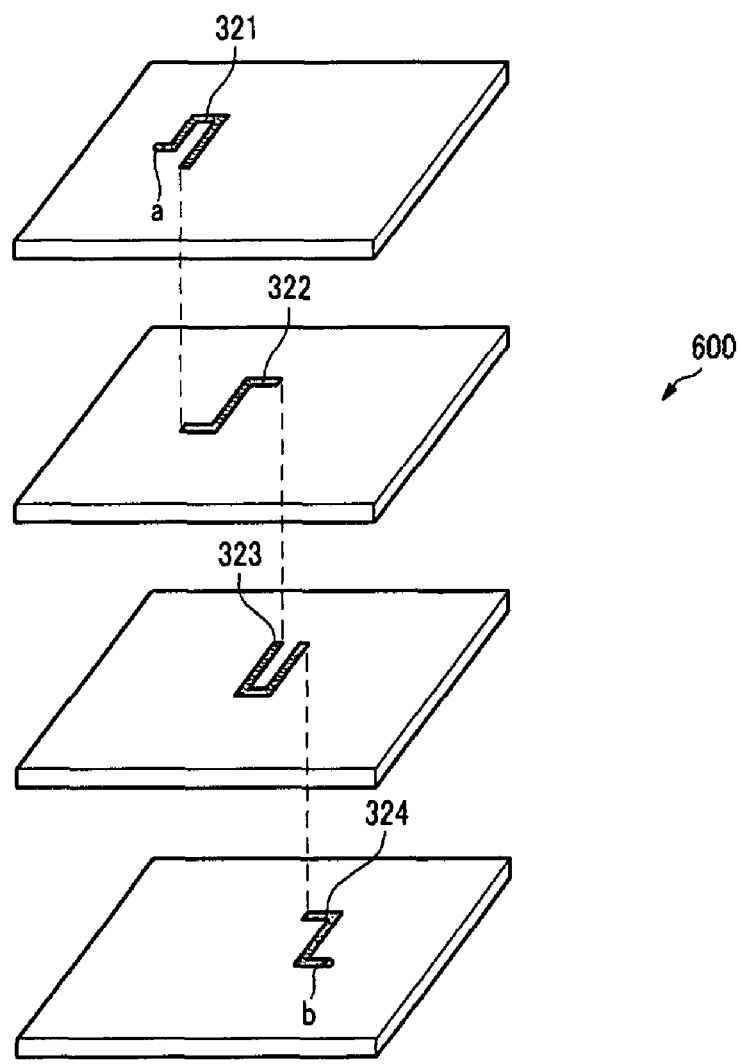
FIG. 8 illustrates (according to an example embodiment of the present invention) an exploded perspective view of a printed circuit board for the wire pattern of an inductor (L) in the address electrode driver depicted in FIG. 6.

FIG. 8 illustrates (according to an example embodiment of the present invention) an exploded perspective view of a printed circuit board for a modified wire pattern of an inductor (L) in the address electrode driver 300' depicted in FIG. 6.

As depicted in FIG. 8, the wire patterns 321-324 together represent a folded line configuration resembling the wire pattern 320 albeit implemented such that the wire patterns 321-324 are formed on respective layers of the PCB 600 so that the corresponding path may be increased.

An operation by the address electrode driver 300' of FIG. 5 and FIG. 6 will now be described with reference to FIG. 9, FIG. 10A, and FIG. 10B.

Figure 9:
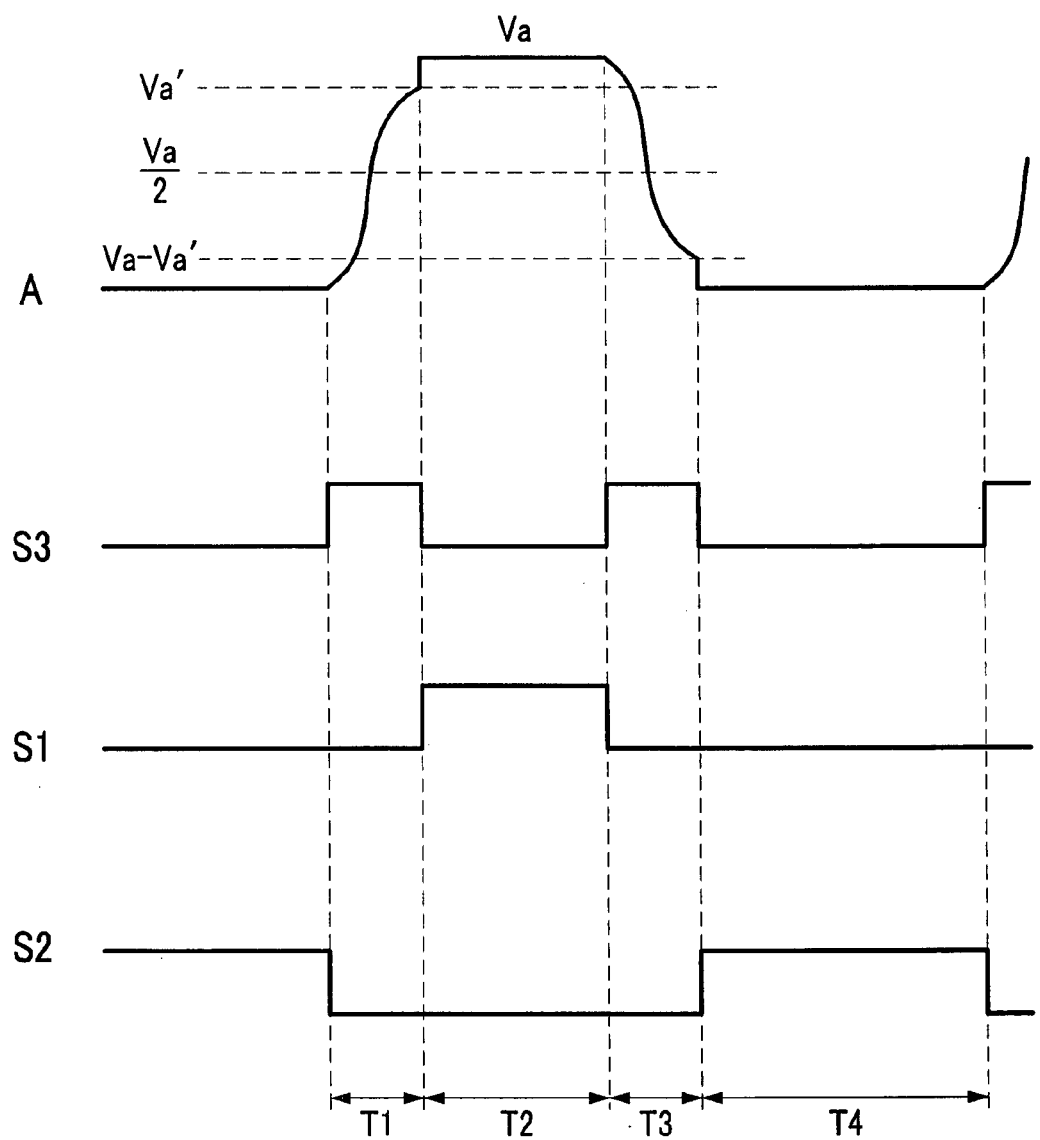
FIG. 9 illustrates a signal timing diagram of an address driving circuit for generating driving waveforms applied to an address electrode according to an example embodiment of the present invention.
Figure 10A:
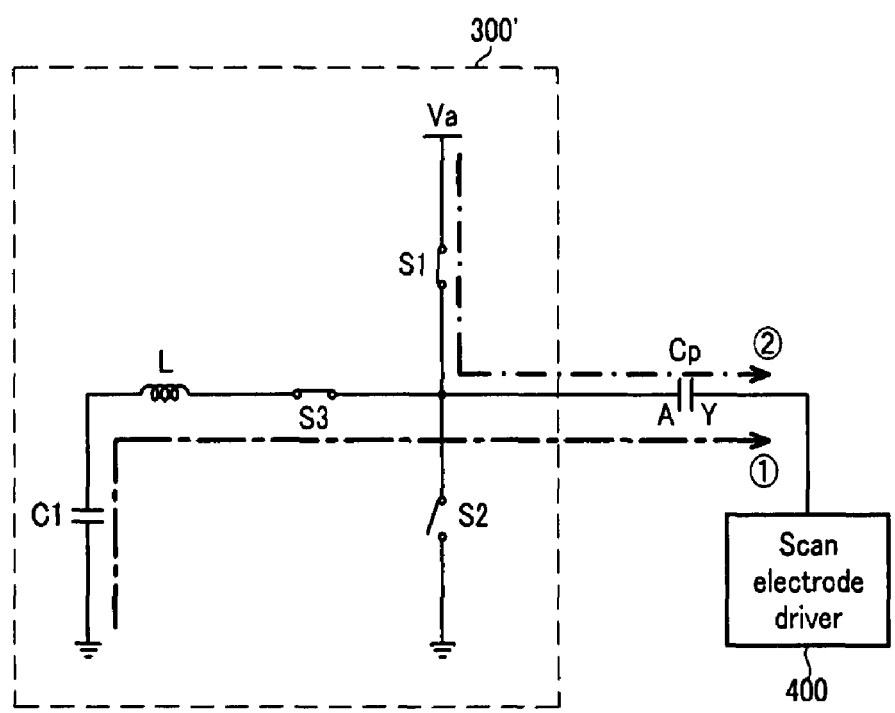
FIG. 10A and FIG. 10B illustrate an address power recovery operation by the address electrode driver depicted in FIG. 5.
Figure 10B:
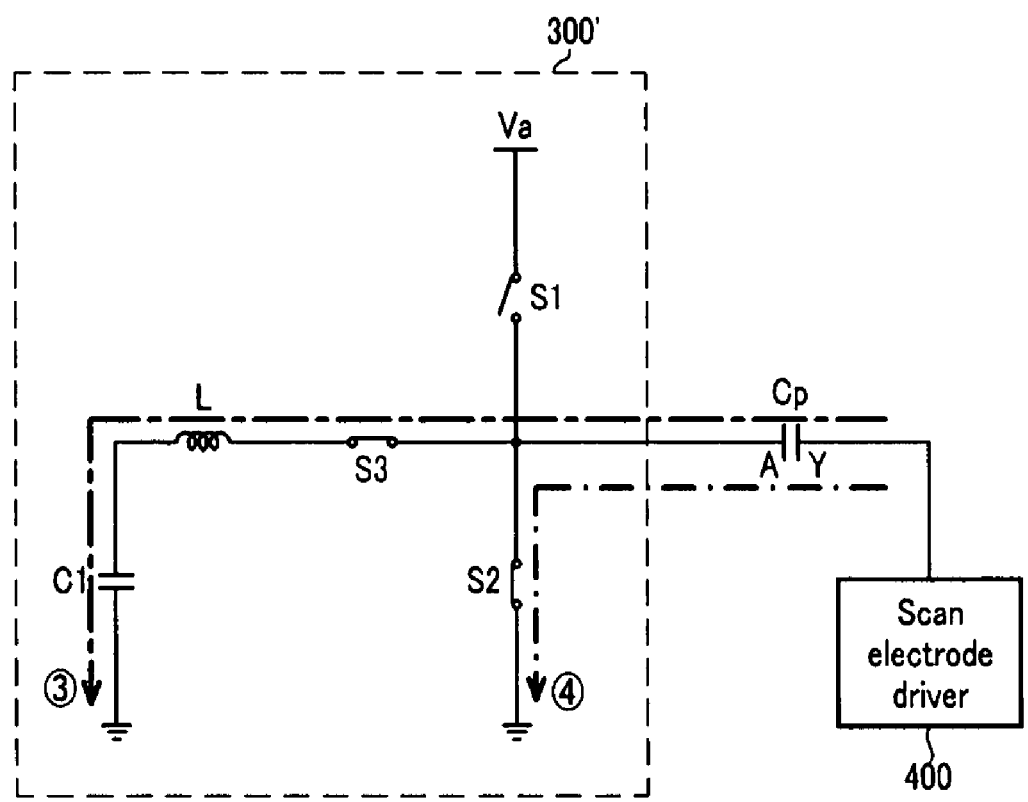

FIG. 9 illustrates a signal timing diagram of an address driving circuit 310' for generating driving waveforms applied to an address electrode according to an example embodiment of the present invention. FIG. 10A and FIG. 10B illustrate an address power recovery operation by the address electrode driver 300' depicted in FIG. 5.

It is assumed in FIG. 9 that the driving waveforms have a dot pattern having the address data consecutively changing and from 0 to 1 and from 1 to 0.

It is assumed that the switch (S1) and the switch (S3) are turned off and the switch (S2) is turned on to maintain the voltage at the panel capacitor (Cp) to be about 0V and the power recovery capacitor (C1) is pre-charged with about half the address voltage (≈Va/2) before a period (T1) starts.

In the period (T1), the switch (S1) remains turned off, the switch (S3) may be turned on and the switch (S2) may be turned off. As depicted in FIG. 10A, a current path (①) is formed through the capacitor (C1), the inductor (L), the switch (S3), and an address electrode of the panel capacitor (Cp). Through the path (①), the voltage charged in the power recovery capacitor (C1) is discharged to the panel capacitor (Cp) so that the voltage at the panel capacitor (Cp) is increased from about 0V to nearly Va (hereafter, Va'), where Va' falls in the range $$\left(\approx \frac{Va}{2}\right) \leq Va' \leq (Va - \delta),$$

where δ denotes a non-negligible amount such that (Va−δ) represents a difference whose magnitude is a non-negligible amount smaller than Va.

In the period (T2), the switch (S2) remains turned off, the switch (S3) may be turned off and the switch (S1) may be turned on. As depicted in FIG. 10A, a current path (②) is formed through the Va power, the switch (S1), and an address electrode of the panel capacitor (Cp). Through the path (②), the Va voltage is applied to the address electrode of the panel capacitor (Cp), raising the voltage on the address electrode of the panel capacitor (Cp) from Va' to Va.

In the period (T3), the switch (S2) remains turned off, the switch (S1) may be turned off and the switch (S3) may be turned on. As depicted in FIG. 10B, a current path (③) is formed through the panel capacitor (Cp), the switch (S3), the inductor (L), and the power recovery capacitor (C1), where the inductor (L) and the power recovery capacitor (C1) together may be regarded as an LC resonance circuit. Through the current path (③), voltage stored in the panel capacitor (Cp) may be discharged to the power recovery capacitor (C1), so that the voltage at the panel capacitor (Cp) may be reduced from the Va voltage to about 0V. In the address driving circuit 310', a greater voltage (about Va) may be recovered to the power recovery capacitor (C1), relative to the voltage that can be recovered by, e.g., the address electrode driver 300 (namely, ≈Va/2).

In the period (T4), the switch (S1) remains turned off, the switch (S3) may be turned off and the switch (S2) may be turned on. As depicted in FIG. 10B, a current path (④) is formed through the panel capacitor (Cp), the switch (S2), and the ground voltage. Through the path (④), the 0V voltage is applied to the address electrode of the panel capacitor (Cp).

Accordingly, the address driving circuit 310' can achieve greater power recovery efficiency than, e.g., the address driving circuit 310. That is, by including the inductor (L) as part of a current path between the power recovery capacitor (C1) and the panel capacitor (Cp), real power transfer between the power recovery capacitor (C1) and the panel capacitor (Cp) is facilitated via reactive power transfer therebetween using LC resonance during the periods (T1 and T3).

Also, address power consumption caused by switching may be reduced and power consumption of the plasma display device may be reduced by recovering or supplying the power to the power recovery capacitor (C1) by turning on or off the switch (S3).

As described above, power consumption in the address period can be reduced and power efficiency of the plasma display device may be increased by using reactive power transfer, e.g., LC resonance between an inductor and a panel capacitor, (where, e.g., the inductor can be realized as wire patterns on the PCB) to facilitate applying an address voltage to the address electrode.

While it has been described that the driving circuits 310 & 310' depicted in FIG. 2 and FIG. 5 are applicable to the address electrode drivers 300 & 300', respectively, the driving circuits 310 & 310' depicted in FIG. 2 and FIG. 5 also may be respectively applicable to the scan electrode driver 400 and/or the sustain electrode driver 500.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device comprising:
   an electrode for receiving a pulse having states that include a first voltage and a second voltage smaller than the first voltage;
   a printed circuit board;
   a driving circuit including a plurality of switches coupled between the printed circuit board and the electrode, and applying the pulse to the electrode;
   a capacitor for storing a third voltage, the third voltage being between the first voltage and the second voltage, the capacitor being provided on the printed circuit board;
   an inductor for coupling the driving circuit and the capacitor, the inductor being provided by at least one wire pattern on the printed circuit board;
   a first switch directly coupled between a first power source and the electrode;
   a second switch directly coupled between a second power source and the electrode; and
   a third switching having a first terminal directly coupled to the electrode, and a second terminal coupled to the capacitor through the inductor;
   wherein the third switch is turned on in a first period during an address period,
   the voltage at the electrode is increased from the second voltage to the third voltage in the first period, with the increase being facilitated by resonance between the panel capacitor and the inductor,
   the first switch is turned on to increase the voltage at the electrode from the third voltage to the first voltage in a second period after the first period,
   the third switch is turned on in a third period after the second period and the voltage at the electrode is reduced form the first voltage to the third voltage, with the reduction being facilitated by the resonance of the panel capacitor and the inductor, and
   the second switch is turned on to maintain the voltage at the electrode to be the second voltage in a fourth period after the third period,
   wherein the second voltage is about ground voltage;
   the first voltage is an address voltage Va; and
   the third voltage has a range of:

$$\left(\approx \frac{Va}{2}\right) \leq V_3 \leq (Va - \delta),$$

where $V_3$ is the third voltage, δ denotes a non-negligible amount, and (Va−δ) represents a difference whose magnitude is a non-negligible amount smaller than Va.

2. The plasma display device as claimed in claim 1, wherein:
   the printed circuit board includes a plurality of substrate layers; and the at least one wire pattern of the inductor is provided on at least one of the substrate layers of the printed circuit board.

3. The plasma display device as claimed in claim 2, wherein the inductor is provided by at least two wire patterns disposed on at least two of the plurality of substrate layers of the printed circuit board, and the at least two wire patterns of the respective layers are coupled.

4. The plasma display device as claimed in claim 1, wherein the driving circuit is installed in a tape carrier package integrated circuit (TCP IC) coupling the electrode and the printed circuit board.

5. The plasma display device as claimed in claim 4, wherein the driving circuit is installed as an integrated circuit in the tape carrier package integrated circuit (TCP IC).

6. The plasma display device as claimed in claim 4, wherein the inductor is provided by a folded wire pattern such that, if unfolded, a length of the wire pattern would be greater than a shortest distance between the driving circuit and the capacitor.

7. The plasma display device as claimed in claim 1, wherein the at least one wire pattern of the inductor is arranged in a curved waveform format or a horseshoe format.

8. The plasma display device as claimed in claim 1, wherein the third voltage is charged in the capacitor through the third switch.

9. The plasma display device as claimed in claim 1, wherein:
   there are multiple instances of the electrode;
   the capacitor, via the inductor, can be coupled to at least two of the multiple instances of the electrode.

10. The plasma display device as claimed in claim 1, wherein the driving circuit is realized in an integrated circuit.

* * * * *